United States Patent [19]
Watanabe et al.

[11] Patent Number: 5,125,014
[45] Date of Patent: Jun. 23, 1992

[54] X-RAY EXPOSURE APPARATUS

[75] Inventors: Yutaka Watanabe, Isehara; Shinichiro Uno, Atsugi; Ryuichi Ebinuma, Kawasaki; Nobutoshi Mitzusawa, Yamato; Shunichi Uzawa, Tokyo, all of Japan

[73] Assignee: Canon Kabushiki Kaisha, Tokyo, Japan

[21] Appl. No.: 578,268

[22] Filed: Sep. 6, 1990

[30] Foreign Application Priority Data

Sep. 7, 1989 [JP] Japan .................. 1-230334

[51] Int. Cl.⁵ .............................. G21K 5/04
[52] U.S. Cl. ..................... 378/34; 378/145; 250/492.2
[58] Field of Search ............ 378/34, 35, 145, 84; 250/492.1, 492.2

[56] References Cited

U.S. PATENT DOCUMENTS

| 4,514,857 | 4/1985 | Kimura et al. | 378/34 |
| 4,984,259 | 1/1991 | Itou et al. | 378/34 |

FOREIGN PATENT DOCUMENTS

| 0131518 | 6/1987 | Japan | 378/34 |
| 243519 | 9/1989 | Japan . | |

OTHER PUBLICATIONS

Patent Abstracts of Japan, Kokai No. 56-104438, vol. 5, No. 179, Nov. 1981.
Patent Abstracts of Japan, Kokai No. 60-7722, vol. 9, No. 118, May 1985.
Patent Abstracts of Japan, Kokai No. 60-226122, vol. 10, No. 79, Mar. 1986.
Haelbich, et al., "Design and Performance of an X-ray Lithography Beam Line at a Storage Ring." J. Vac. Sci. Technol. B1(4), Oct.-Dec. 1983, pp. 1262 through 1266.

Primary Examiner—Janice A. Howell
Assistant Examiner—David P. Porta
Attorney, Agent, or Firm—Fitzpatrick, Cella, Harper & Scinto

[57] ABSTRACT

An exposure apparatus for exposing a substrate with X-rays is disclosed. The apparatus includes a radiation source for providing X-rays; and a convex mirror for reflecting the X-rays from the radiation source toward the substrate to expose a zone of the substrate with the X-rays; wherein the convex mirror and the substrate are so interrelated that a peak position of intensity distribution of the X-rays upon the zone deviates from the center of the zone.

6 Claims, 14 Drawing Sheets

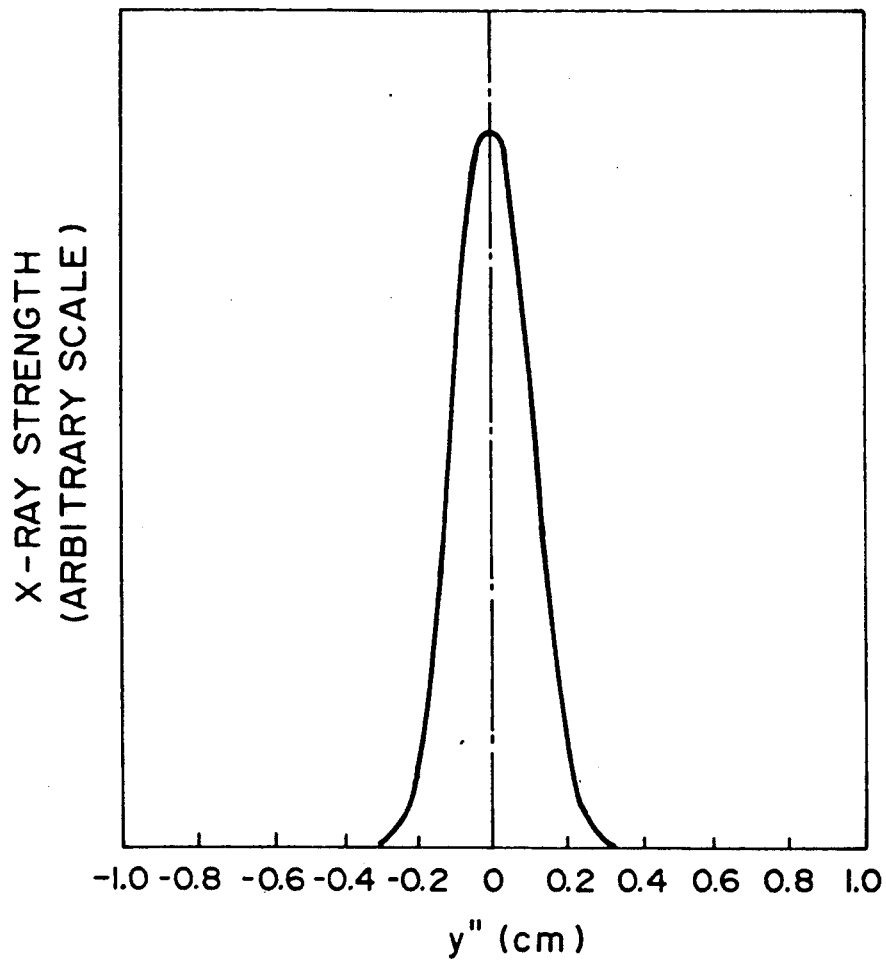
X-RAY STRENGTH DISTRIBUTION
JUST BEFORE MIRROR
F I G. 2A

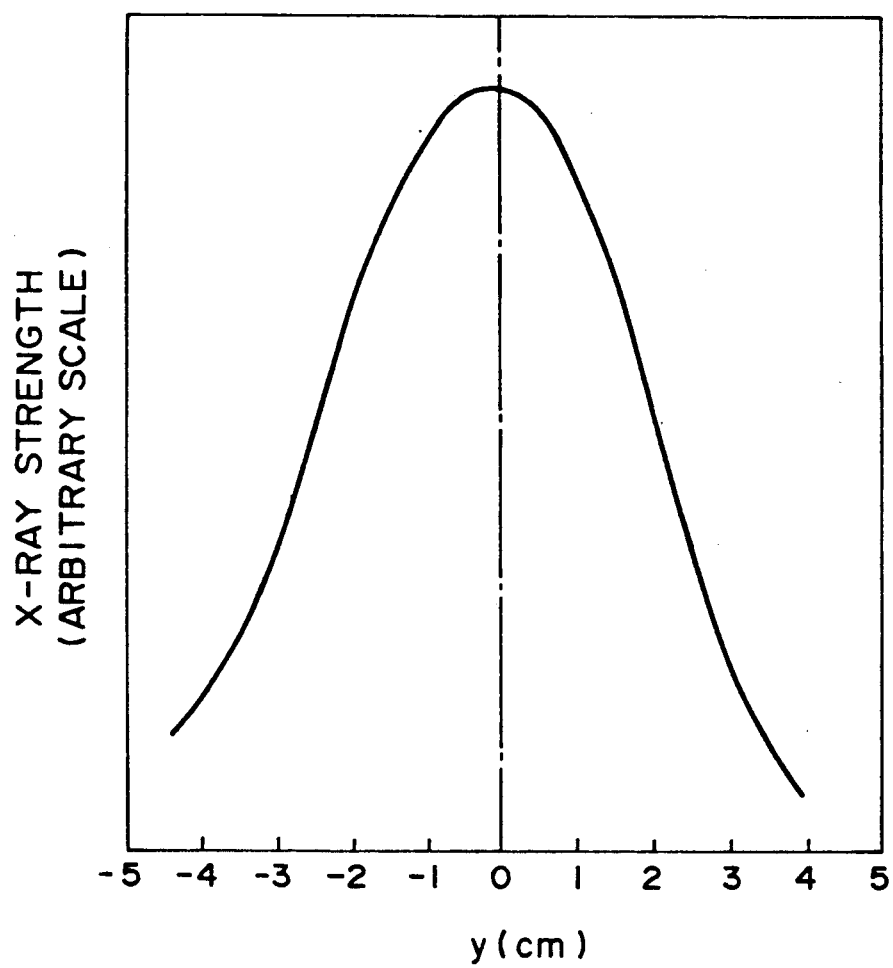
X-RAY STRENGTH DISTRIBUTION
ON RESIST COATED WAFER
F I G. 2B

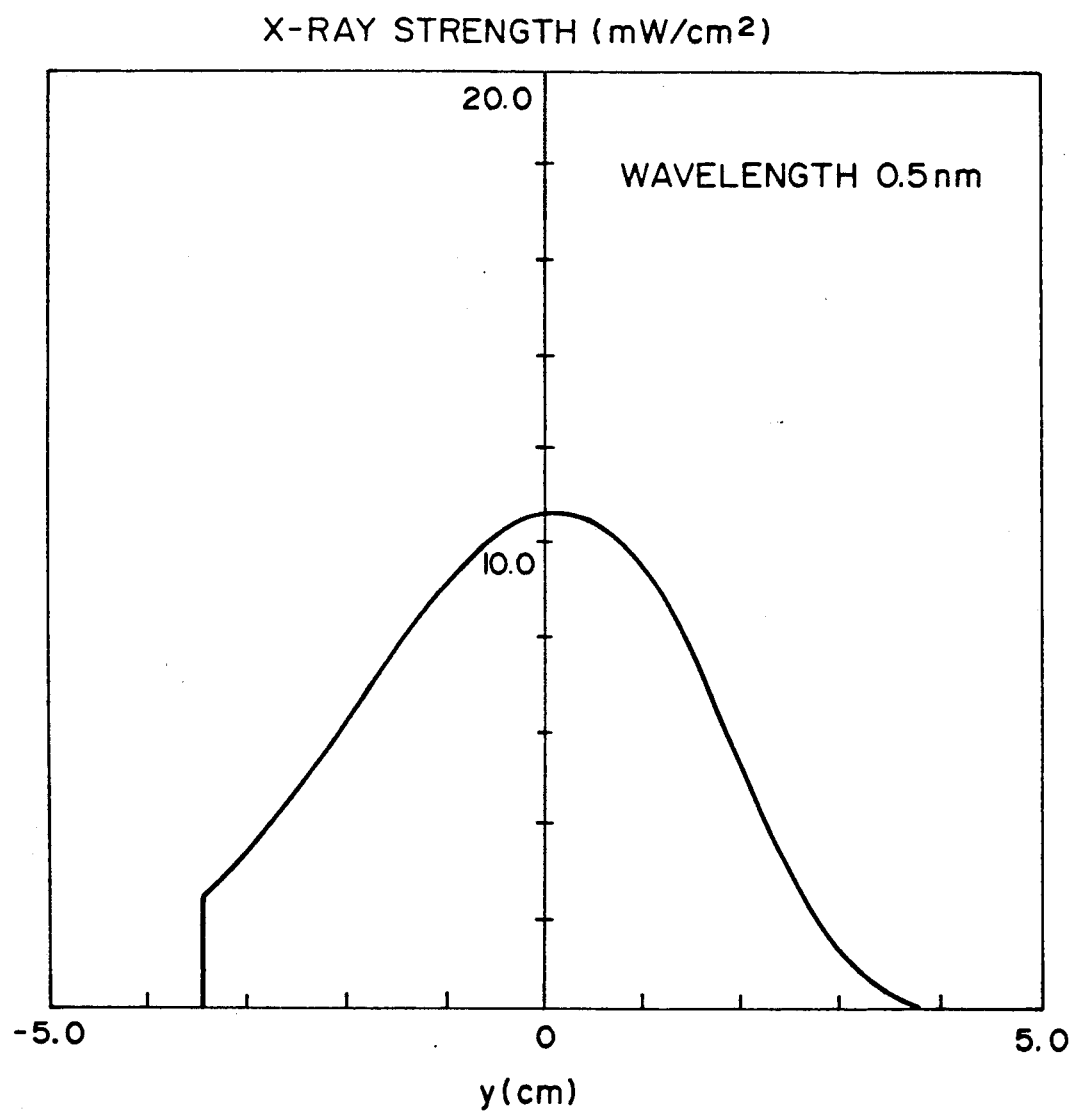
F I G. 4B

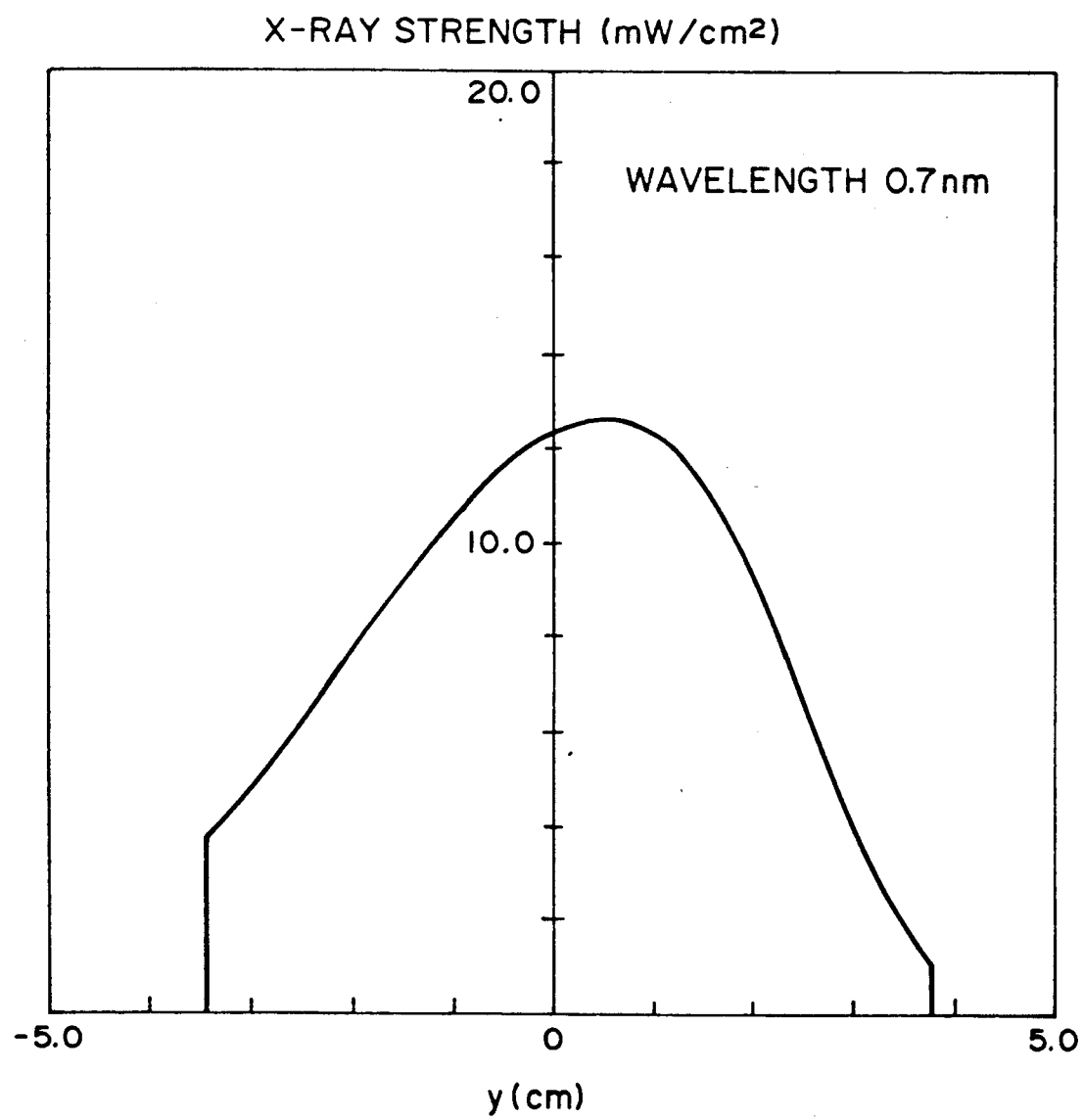
F I G. 4C

X-RAY EXPOSURE APPARATUS

FIELD OF THE INVENTION AND RELATED ART

This invention relates to an X-ray exposure apparatus and, more particularly, to an X-ray exposure apparatus adapted to expand X-rays from a synchrotron orbit radiation (SOR) light source and to expose a zone on a workpiece to a mask pattern with the expanded X-rays.

An SOR light source is such a light source that emits sheet-like electromagnetic waves (X-rays and so on) at a large angle of divergence in a horizontal direction (i.e., a direction parallel to the horizontal orbit plane of the SOR light source), but at a small angle of divergence in a direction perpendicular thereto (i.e., a direction perpendicular to the horizontal orbit plane of the SOR light source). Because of small angles of divergence in the perpendicular direction, if the X-rays from the SOR light source are projected directly to a mask, only a small range of the mask with respect to the perpendicular direction can be illuminated. In consideration thereof, in an X-ray exposure apparatus using an SOR light source, some measure has to be adopted to expand the range of illumination, with respect to the perpendicular direction, to be illuminated with the X-rays from the SOR light source.

An example is a method in which a mirror is disposed between an SOR light source and a zone to be exposed and the mirror is oscillated at an angle of a few milliradians (R. P. Haelbich et al, "Journal of Vac. Sci. Technol.", B1(4), Oct.-Dec., 1983, pages 1262-1266).

In this mirror oscillation method, however, at each moment of time, only a small portion of the zone to be exposed is irradiated with the radiation beam. This raises a possibility that the zone to be exposed, for example, a mask on which a circuit pattern region is defined, is locally expanded to cause distortion of the circuit pattern, which is transferred onto a wafer. Thus, a pattern transfer error is produced and it is difficult to assure correct transfer of a fine circuit pattern onto the wafer. Such a transfer error cannot be avoided unless the oscillation period of the mirror is shortened sufficiently. However, in order to reduce the oscillation period sufficiently, a large driving power is necessary and this is not practical where a large size mirror is used as in an X-ray exposure apparatus.

Another example of expanding the range of illumination is a method in which a convex mirror is disposed between an SOR light source and a zone to be exposed, such that by the reflection at the convex reflection surface of the mirror the angle of divergence (beam diameter) of the X-ray beam in the perpendicular direction is expanded (Warren D. Grobman, "Handbook on Synchrotron Radiation", Vol. 1, chapter 13, page 1135, by North-Holland Publishing Co., 1983).

If this method is applied to an X-ray exposure apparatus, the problem of local distortion of the circuit pattern as described hereinbefore may ba solved However, this method still involves a problem. That is, in the horizontal orbit plane, the X-rays emanating from an SOR light source can be considered as being substantially uniform in intensity at every divergence angle. However, with respect to a direction perpendicular to this plane, the X-rays provide an intensity distribution which is substantially in the form of a Gaussian distribution. Thus, there is a difference in X-ray intensity, between a central portion and an end portion of the zone to be exposed.

The X-rays emitted by an SOR light source have a wavelength distribution similar that of white X-rays. However, a desirable SOR light source for use in the X-ray lithography is such an SOR light source as providing such X-rays wherein the intensity distribution has a peak in the wavelength range of 0.2-1.0 nm and wherein the X-ray intensity at a wavelength not longer than 0.1 nm or not shorter than 10 nm is lower, by a few orders, than the peak intensity. The X-rays emitted by such an SOR light source are reflected by the mirror and pass through a beryllium window. Then, the X-rays pass through a mask membrane and, even after this, although the intensity decreases in the short wavelength components (not longer than 0.1 nm) and in the long wavelength components (not shorter than 2 nm), continuous wavelength components therebetween are retained. Generally, depending on the wavelength of the X-rays, the reflection factor of a mirror, the transmission factor of a beryllium window or the transmission factor of a mask membrane differs Additionally, the reflection factor of a mirror largely depends on the angle of incidence of X-rays thereto. Thus, when a convex mirror is used to expand the divergence angle of an X-ray beam, the intensity distribution of X-rays emitted by an SOR light source, which is a Gaussian distribution with respect to a direction perpendicular to the horizontal orbit plane, is transformed into an asymmetric distribution after the X-rays are reflected by the mirror, transmitted through the beryllium window and through the mask membrane.

Moreover, at each point on a transverse section of X-rays in a direction perpendicular to the horizontal orbit plane of an SOR light source, the spectral intensity distribution differs As a result, even if at different points on a wafer the same X-ray intensity is measured through an X-ray detector having no wavelength resolving performance, it is possible that the exposure time necessary for correct exposure of a resist with a predetermined exposure amount differs with the point on the wafer, because of the wavelength dependence of the sensitivity of the resist to the X-rays.

SUMMARY OF THE INVENTION

It is a primary object of the present invention to provide an improved X-ray exposure apparatus.

It is another object of the present invention to provide an improved X-ray exposure method.

In accordance with a first aspect of the present invention, to achieve this or other objects, there is provided an exposure apparatus for exposing a substrate with X-rays, said apparatus comprising: a radiation source for providing X-rays; and a convex mirror for reflecting the X-rays from said radiation source toward the substrate to expose a zone of the substrate with the X-rays; wherein said convex mirror and the substrate are so interrelated that a peak position of intensity distribution of the X-rays upon the zone deviates from the center of the zone.

In accordance with a second aspect of the present invention, there is provided an x-ray exposure apparatus for exposing a zone of a wafer to a pattern of a mask with X-rays, said apparatus comprising: a radiation source for providing X-rays; and an illumination optical system for illuminating the mask and then the zone of the wafer with the X-rays, said illumination optical system including a convex mirror for reflecting the X-rays toward the mask and the wafer, wherein said convex mirror is disposed such that the X-rays irradiating the zone of the wafer provide an intensity distribution on the zone having a peak which is positioned at a distance from an end of the zone closer to said convex mirror, which distance provides irradiation 20–45% of the area of the zone.

In accordance with a third aspect of the present invention, there is provided an x-ray exposure apparatus for exposing a zone of a wafer to a pattern of a mask with X-rays, said apparatus comprising: a synchrotron radiation source having a plane of horizontal orbit for providing X-rays; and an illumination optical system for illuminating the mask and then the zone of the wafer with the X-rays, said illumination optical system including a convex mirror for reflecting the X-rays toward the mask and the wafer and being effective to expand a beam diameter of the X-rays with respect to a first direction which is perpendicular to the plane of horizontal orbit of said synchrotron radiation source, wherein said convex mirror is disposed such that the X-rays irradiating the zone of the wafer provide an intensity distribution on the zone having a peak which is positioned, with respect to a second direction corresponding on the zone to the first direction, at a distance from an end of the zone closer to said convex mirror, which distance provides irradiation of 20–45% of the area of the zone in the second direction.

In accordance with a fourth aspect of the present invention, there is provided an x-ray exposure apparatus for exposing a zone of a wafer to a pattern of a mask with X-rays, said apparatus comprising: a synchrotron radiation source having a plane of horizontal orbit, for providing X-rays; and an illumination optical system for illuminating the mask and then the zone of the wafer with the X-rays, said illumination optical system including a convex mirror for reflecting the X-rays toward the mask and the wafer and being effective to expand a beam diameter of the X-rays with respect to a first direction which is perpendicular to the plane of horizontal orbit of said synchrotron radiation source, said illumination optical system further including a scanner for scanning the zone of the wafer with the diameter-expanded X-rays, said scanner having an opening of a predetermined shape and being movable in a second direction along the mask and corresponding on the zone of the wafer to the first direction; wherein said convex mirror is disposed such that the X-rays irradiating the zone of the wafer provide an intensity distribution on the zone having a peak which is positioned, with respect to the second direction, at a distance from an end of the zone closer to said convex mirror, which distance provides irradiation of 20–45% of the area of the zone in the second direction.

In these aspects of the present invention, regardless that the X-rays have an asymmetric intensity distribution on the zone of a wafer to be exposed, it is possible to provide, in this zone, a substantially symmetrical distribution of the quantity of X-ray absorption of a resist, per unit time, as applied onto the wafer.

As a result, at the opposite end portions of the zone to be exposed, substantially the same quantity of X-ray absorption of a resist, per unit time, can be set. This assures substantial reduction in the exposure time, on an occasion when the zone of the wafer is scanningly exposed by means of a scanner and with X-rays expanded by a convex mirror, wherein the scanner is movable along a direction (scan direction) connecting these end portions and wherein the scanner is formed with an opening (slit) of a predetermined shape. In such a scanning exposure, the moving speed of the scanner is modulated throughout the extent of the zone with respect to the scan direction, to ensure that the quantity of X-ray absorption by the resist is uniform.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are graphs showing an X-ray intensity distribution at a position just before a mirror in the apparatus of FIG. 1 and an X-ray intensity distribution on the wafer, respectively.

FIGS. 4A–4D are graphs, respectively, showing X-ray intensity distributions on a wafer, with different wavelengths, in the apparatus of FIG. 1.

DESCRIPTION OF THE PREFERRED EMBODIMENTS

Figure 1:
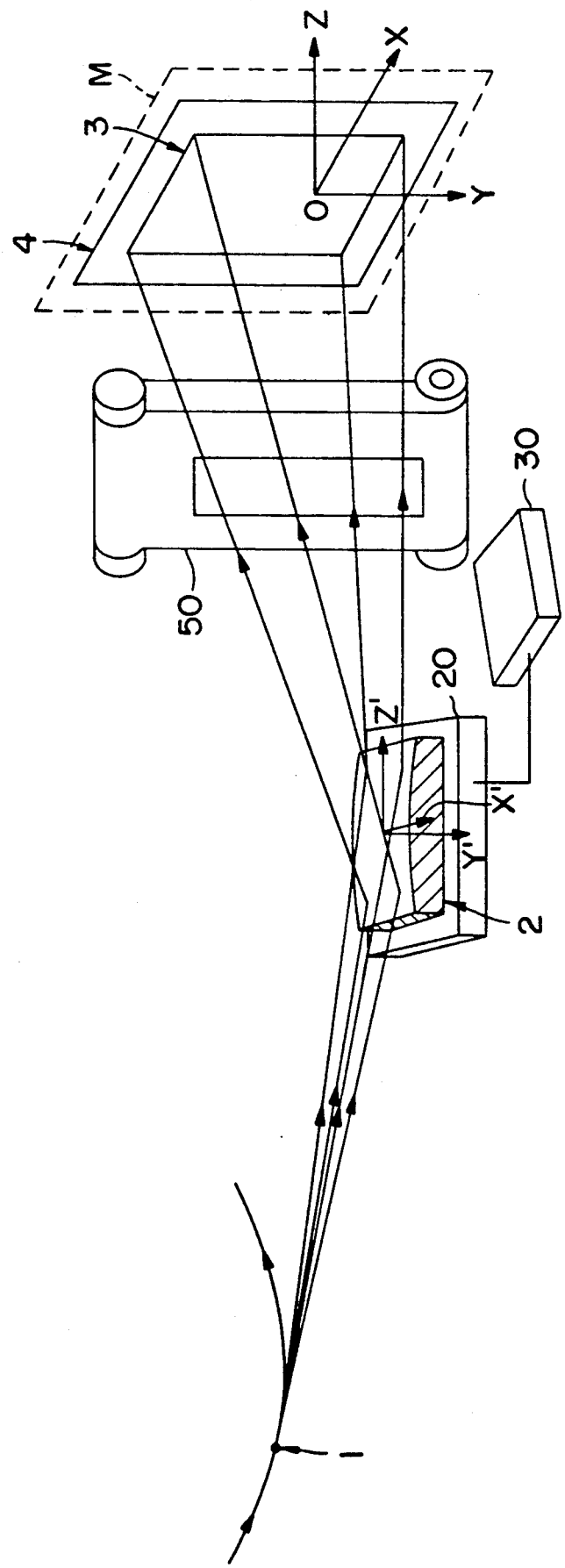
FIG. 1 is a perspective view schematically showing an exposure apparatus according to an embodiment of the present invention.

Referring to FIG. 1 showing the structure of an exposure apparatus according to an embodiment of the present invention, reference numeral 1 denotes a light emission point of an SOR light source. Cylindrical mirror 2 has a reflection surface of convex shape. Reference numeral 3 denotes an exposure region, namely, a rectangular zone on a wafer which is coated with a resist. Reference numeral 4 denotes a two-dimensional plane which contains the region 3 to be exposed. Mask M has a circuit pattern (not shown) formed thereon, and is placed between the mirror 2 and the wafer, parallel to the plane 4. The mask M and the wafer are supported by unshown movable stages, respectively. By moving these stages, the position or attitude of the mask M and the wafer can be changed. On the other hand, as illustrated, the mirror 2 is supported by a movable stage 20 which can be moved by means of a driver 30 to change the position or attitude of the mirror 2.

The mask M and the wafer (zone 3) are disposed with a clearance or gap on an order of a few tens of microns. X-rays emitted from the light emission point 1 of the SOR light source are reflected by the mirror 2 and the reflected X-rays illuminate the mask M. By this, the region 3 to be exposed can be exposed to the X-rays passed through the circuit pattern of the mask M, whereby the circuit pattern is transferred or printed on the resist of the region 3.

Although not shown in FIG. 1, the illumination optical system of the exposure apparatus of the present embodiment includes stop means (masking blade means)

provided between the mirror 2 and the mask M, for extracting a bundle of X-rays of a size corresponding to the size of the region 3. The illumination optical system also includes scanner 50 provided between the stop means and the mask M and having a rectangular opening which is displaceable upwardly or downwardly as viewed in the drawing. The opening of this scanner is scanningly displaced in the neighborhood of the mask M, and the moving speed thereof is modulated, during the scan, throughout the extent of the region 3 so as to assure that a uniform quantity of X-rays is absorbed by the resist material on the region 3. Details of such a scanner are disclosed in Japanese Laid-Open Patent Application, Laid-Open No. 1-243519, filed in the name of the assignee of the subject application. The illumination optical system further includes various components such as a beryllium window, for example, which are commonly used in X-ray exposure apparatuses.

The region 3 has a size of about $15 \times 15$ mm$^2$–$30 \times 60$ mm$^2$. The coordinate system xyz is a coordinate system which is fixed with respect to the plane 4, while the coordinate system x'y'z' is a coordinate system having an origin on the surface of the mirror 2. The x-z plane of the coordinate system xyz and the x'z' plane of the coordinate system x'y'z' are set approximately parallel to or with a small inclination to the horizontal orbit plane of the SOR light source. The x-y plane of the coordinate system xyz coincides with the plane 4. Also, the x axis of the coordinate system xyz and the x' axis of the coordinate system x'y'z' are codirectional with the direction of the generating line of the mirror 2. The mirror 2 reflects the X-rays from the light emission point 1 toward the mask M, so as to expand the divergence angle and the beam diameter of the X-rays with respect to the y axis of the coordinate system xy or the y' axis of the coordinate system x'y'z'.

FIG. 2A illustrates the X-ray intensity distribution just upstream of the mirror 2, in a direction (y" axis direction) perpendicular to the SOR orbit plane, and FIG. 2B illustrates the X-ray intensity distribution (in the y direction in FIG. 1) upon a wafer coated with a resist (after transmission through the mask membrane). It is to be noted that the SOR light source used in this example is of the type having accumulated energy of 650 MeV and a radius of curvature of 0.5 m, and the distance from the light emission point 1 to the center of the mirror 2 (the origin of the coordinate system xyz) is 2.5 m. In this embodiment, for assuring an exposure region of a size of 30 mm square, the radius of curvature of the mirror 2 is made equal to 50 m. The origin of each coordinate system is set at such a position at which the X-ray intensity becomes maximum. Just upstream of the mirror, it is on the horizontal orbit plane of the SOR light source. On the resist coated wafer, it is at a side, closer to the mirror 2, of the position at which the X-rays (a chief ray thereof) emitted from the light emission point 1 along the horizontal orbit plane an then reflected by the mirror 2 impinges on the plane 4, namely, it is positioned closer to the lower end of the zone 3.

It is to be noted here that, as will be described later, when the X-ray intensity distribution upon a wafer is detected by using an X-ray detector having no wavelength resolving power, the detected intensity distribution does not always correspond to the distribution of X-ray quantity as absorbed by the resist.

Figure 3A:
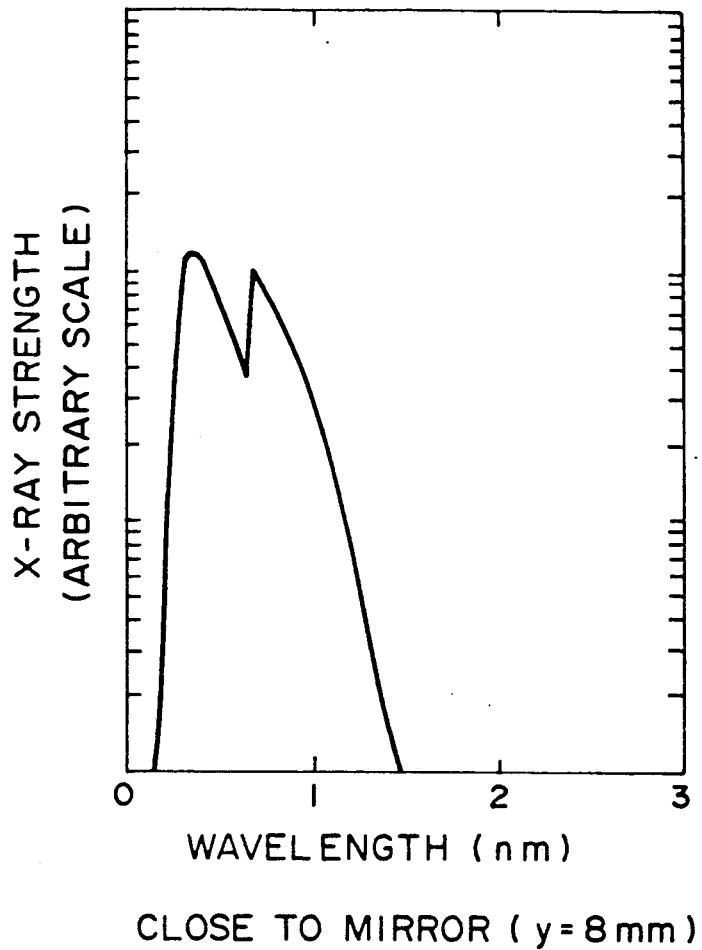
FIGS. 3A and 3B are graphs, respectively, showing X-ray intensity spectrums at two different points on a wafer, in the apparatus of FIG. 1.
Figure 3B:
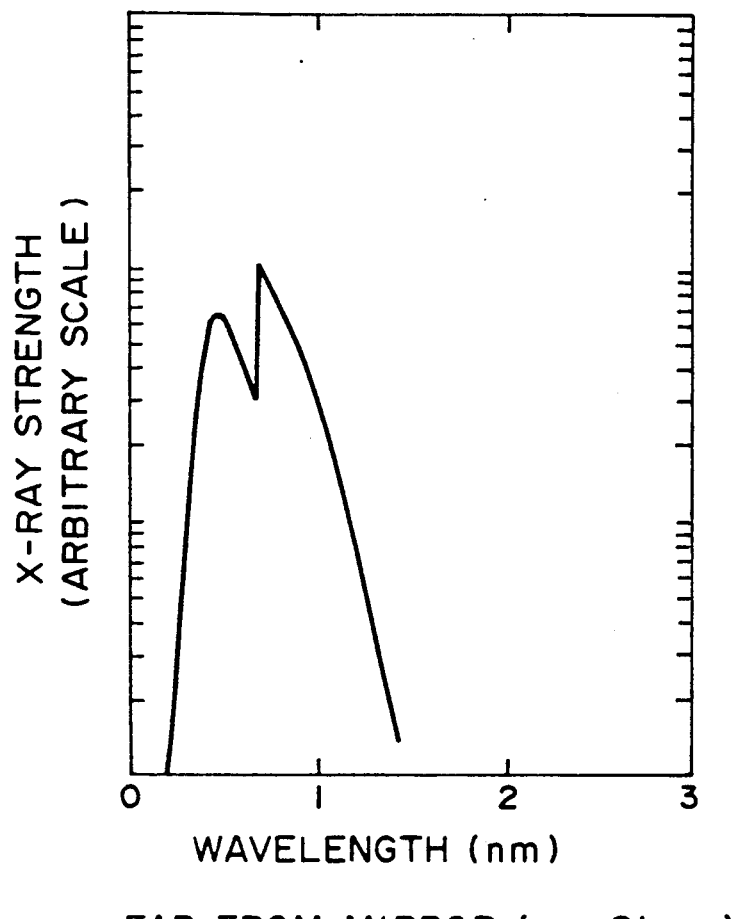
Figure 4A:
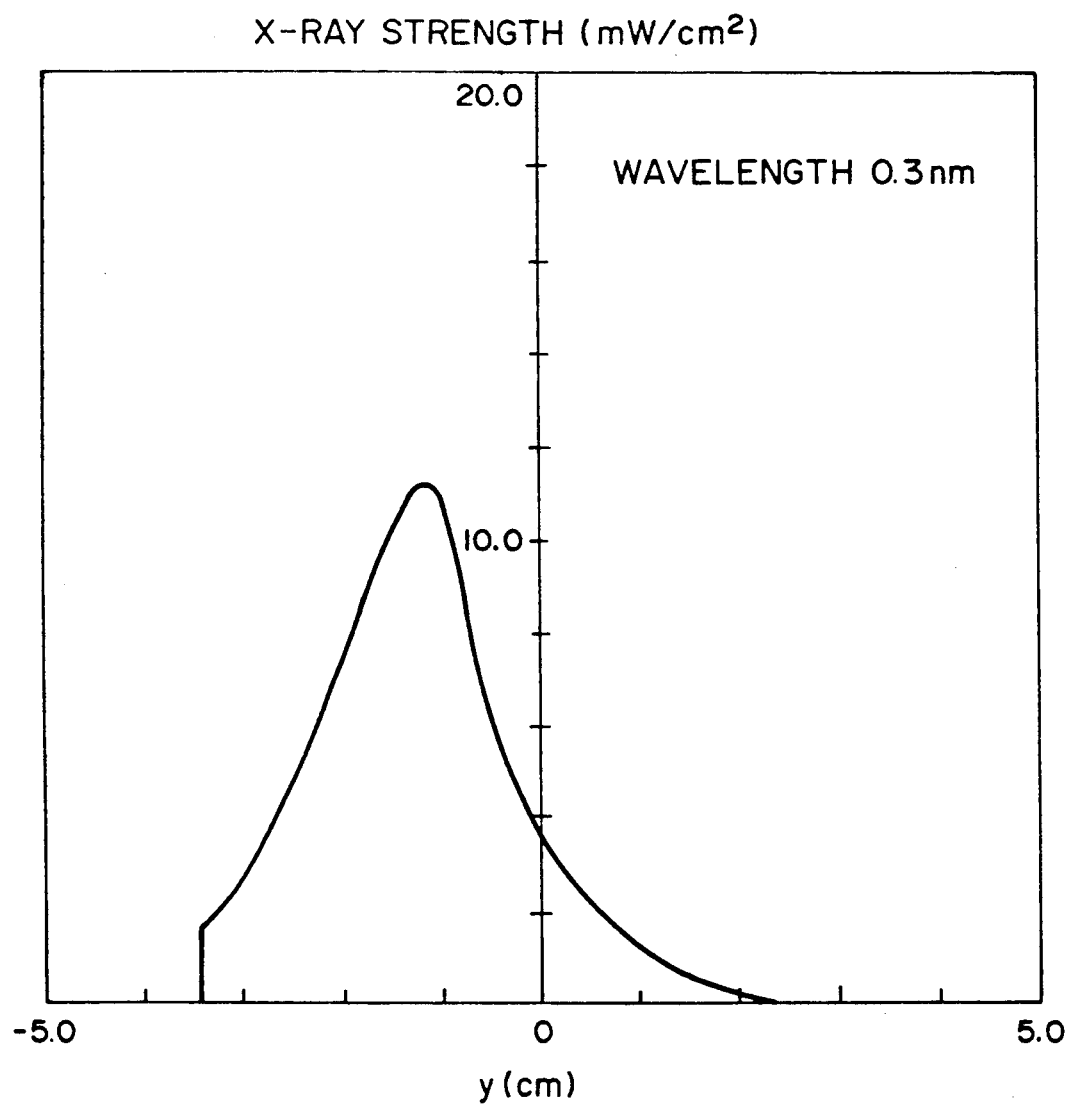
Figure 4D:
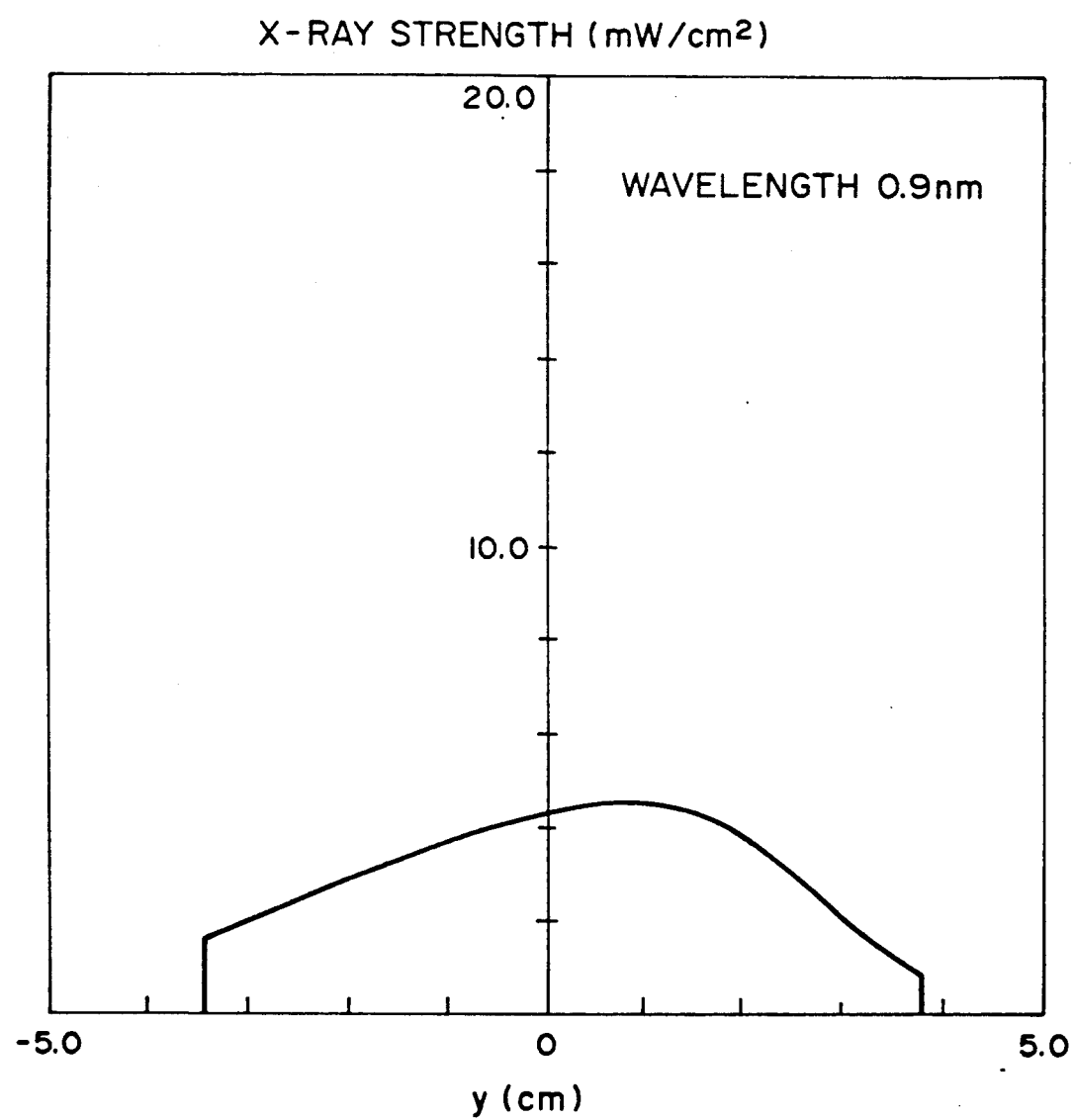

FIGS. 3A and 3B illustrate the X-ray intensity spectrums at two points (y = 8 mm and y = −21 mm) on a wafer coated with a resist. The decrease in the X-ray intensity about the wavelength of 0.7 nm attributes to the reduction in the reflection factor of the mirror due to the Si absorption of the mirror. Here, it is seen from FIG. 1 that an X-ray impinging on a point in the region 3, at a side (lower edge) closer to the mirror 2 is one having been impinged on the reflection surface of the mirror 2 at a smaller angle, as compared with an X-ray impinging on the side (upper edge) of the region 3 far from the mirror 2. The shorter the wavelength of the X-ray is, the larger the decrease in the reflection factor is, to the impingement of X-rays at a large angle. FIGS. 4A–4D show intensity distributions of X-rays, upon a wafer, of wavelengths of 0.3 nm, 0.5 nm, 0.7 nm and 0.9 nm, when used in the apparatus of FIG. 1. As seen in FIGS. 4A–4D, the shorter the wavelength is, the quicker the X-ray intensity decreases in a portion of the resist coated wafer at a side far from the mirror 2. For this reason, in the case of an X-ray (FIG. 3A) impinging on a point at a side of the region 3 closer to the mirror 2, the ratio of the short wavelength component, more particularly, the ratio of the wavelength component shorter than the Si absorption edge of the mirror, is high as compared with that of an X-ray (FIG. 3B) impinging on the region 3 at a side far from the mirror 2. If, therefore, the X-ray intensity is detected by using an X-ray detector having no wavelength resolving performance, in spite of the X-ray spectrum being different at different points in the region 3, the X-ray intensity would be detected with the spectrums of FIGS. 3A and 3B being integrated. On the other hand, the ratio of X-rays absorbed by a resist to the inputted X-rays differs largely if the wavelength differs largely For example, in the case of X-rays of 0.8 nm, about 10% will be absorbed by a resist. On the other hand, in the case of X-rays of 0.3 nm, only about 0.5% will be absorbed by the resist. For this reason, the short wavelength component, particularly, the wavelength component shorter than the Si absorption edge, is not so effective in the point of absorption by and thus sensitization of the resist. Thus, when the X-ray intensity is detected at the two points shown in FIGS. 3A and 3B by using an X-ray detector having no wavelength resolving performance, despite that the measured intensities being different from each other, it is possible that the irradiation of the resist with X-rays for the same time period results in formation of the same residual film thickness after the development, and that the X-ray absorption quantities are substantially equal to each other.

Figure 5:
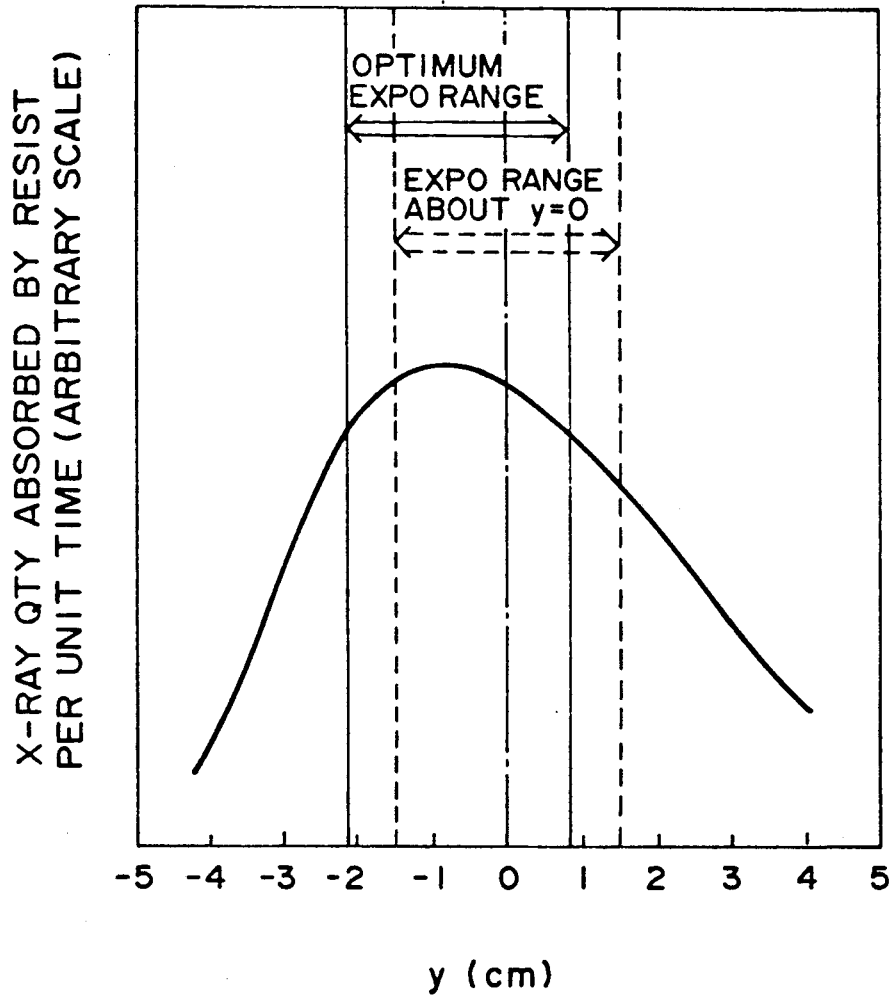
FIGS. 5 and 8 are graphs, respectively, each showing a distribution of X-ray quantity absorbed by an acrylate resin resist per unit time, in the apparatus of FIG. 1.
Figure 6:
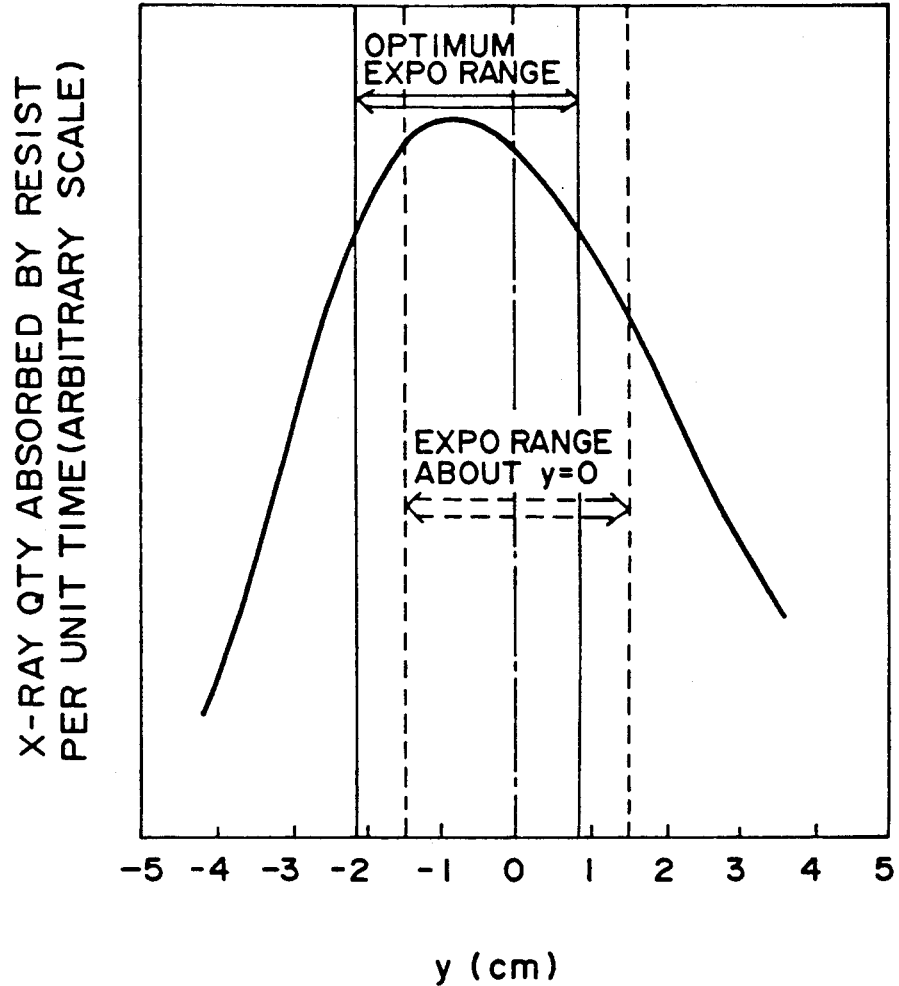
FIGS. 6 and 9 are graphs, respectively, each showing a distribution of X-ray quantity absorbed, per unit time, by a resist of a phenol-acrylate copolymer, containing a halogen series element.

The quantity of X-rays absorbed by a resist can be estimated by examining the residual film thickness of the resist after the development. As an example therefor, FIG. 5 illustrates a distribution of the X-ray quantity absorbed by an acrylate resin resist per unit time, in a case where by using the apparatus of FIG. 1 a wafer coated with such a resist is exposed. The origin of the coordinates is the same as in FIG. 2B. Also, FIG. 6 illustrates a distribution of X-ray quantity as absorbed per unit time by a phenol-acrylate copolymer resist, containing a halogen series element, on an occasion when by using the apparatus of FIG. 1 a wafer which is coated with such a resist is exposed. The quantity of absorption of X-rays of a certain wavelength by a resist material depends on the elements constituting the resist, the component ratio thereof, the density thereof and the like. In a resist which is an organic material, genera'.\ the density is not different largely. Also, a resist which contains a halogen series element shows large absorbency to short wavelength X-rays, as compared with a resist not containing such an element. However, as will be seen from comparison cf FIG. 5 with FIG. 6, the shape of the distribution of the X-ray quantity absorbed by the resist is substantially the same, although there is a difference in the absolute value therebetween. Also, each of these distributions is substantially symmetrical with respect to the center of the region 3.

Similarly, in the case of a novolak resin resist containing a halogen series element or other organic resist materials, the distribution of X-ray quantity absorbed by the resist has substantially the same configuration (profile) as illustrated in FIG. 5 or 6.

When a resist shows an X-ray absorption distribution such as illustrated in FIG. 5 or 6, and if, for scanning exposure of a wafer by using a scanner such as described hereinbefore, the position on the resist coated wafer at which the X-ray intensity is highest (the peak of the intensity distribution), namely, y=0, is set to be coincide with the center of the region 3, then the exposure time is prolonged by about 3% to 5%, as compared with a case wherein, as in the present embodiment, the center of the region 3 is deviated from the position y=0, since in the present embodiment the region 3 has a size of 30 mm square. Here, the exposure time means the time period necessary for completing the exposure of the region 3 as a whole.

When in the present embodiment, as described, the opening (slit) of the scanner having a leading edge and a trailing edge is moved across the path of X-rays to scanningly expose the region 3, in the y direction, with the X-rays passed through the opening, the exposure time period for irradiation of the resist with X-rays at different positions in the y coordinate on the region 3 is controlled by controlling the moving speed of the opening as it scans each position, so as to assure that the non-uniformness in the quantity of X-ray absorption by the resist material throughout the region 3 is reduced to 5% or lower, preferably, 2% or lower. In other words, for a position at which the quantity of X-ray absorption per unit time is low, the exposure time is increased to thereby increase the quantity of X-ray absorption (dose) at that position In order to reduce the total exposure time in such scanning exposure, the position of the exposure region 3 with respect to the X-rays is set so that, at the opposite end portions of the region 3 with respect to the y direction, the same quantity of X-rays are absorbed by a resist per unit time. Such a position of the region 3 is depicted as an "optimum exposure range" in FIG. 5 or 6, and this is attainable with the present embodiment. In the present embodiment, such an optimum exposure region can be set easily, without experimentally detecting the quantity of X-rays absorbed by a resist per unit time from the remaining film thickness of the resist based on exposure of the same. That is, the optimum exposure region can be set first by measuring the X-ray intensity distribution upon the plane 4 by using an X-ray detector and second by setting the region 3 so that the maximum intensity position (peak position) is placed at the position in the exposure region 3 which is at a distance of about 20–45% from the mirror 2 side thereof. More specifically, in the present embodiment, the peak position of the X-ray intensity distribution is set at a position of 28% of the region 3 from the mirror 2 side thereof and on the basis of the thus determined position the optimum exposure region is determined Here, the X-ray quantity absorbed by a resist per unit time has a distribution of wave crest shape. Accordingly, when the X-ray quantities are absorbed by a resist, at the maximum X-ray absorption quantity position in the distribution and at the upper end position and lower end position of the region 3, with respect to the scan direction by the scanner, per unit time and unit area, are denoted by $I_{MAX}$, $I_U$ and $I_L$, then the time t necessary for the scanning exposure can be expressed as follows:

$$t = A(1/I_U + 1/I_L - 1/I_{MAX}) + l/V_0 \tag{1}$$

wherein l is the length in the up-and-down direction (scan direction) of the region 3, and $V_0$ is the maximum moving speed of the opening (slit) which is about 300 mm/sec. The character A denotes the quantity of X-ray absorption necessary for exposure of the resist. When the X-ray intensity distribution is measured by using an X-ray detector and, when the maximum intensity position is set at a position of 20–45% from the mirror side, by substituting $I_U$, $I_L$ and $I_{MAX}$ at that position into equation (1), it is seen that the exposure time can be reduced as compared with an occasion when the peak position of the X-ray intensity distribution coincides with the center of the region 3. In this manner, by determining the "optimum exposure region" by setting the peak position at a position (distance) of 20–45%, it is possible to set the position of the exposure region to the X-rays, in the way avoiding prolongation of exposure time.

As a method of setting the region 3 to the location of the "optimum exposure region", namely, as a method of setting the maximum X-ray intensity position (peak position) at a position of 20–45% from the mirror 2 side of the exposure region 3, there is a method based on translational movement of the mirror 2 in the y' axis direction and rotational movement of the mirror 2 about the x' axis, using the stage 20 and the driver 30. In this method, it is necessary that, at a pre-stage before the setting, the SOR orbit plane is parallel to the x' axis of the mirror 2 (the x' axis may be contained in the SOR orbit plane) and that the X-rays emanating along the SOR orbit plane and the x' axis of the mirror 2 are placed orthogonal to each other As another method of setting the region 3 into the "optimum exposure region", there is a method in which the stop means (masking blade means) which defines the exposure region 3 to the X-rays is translationally displaced in the y axis direction. On this occasion, if the mask M and the wafer are held fixed, it is possible that the X-rays are not projected to a desired location on the mask M or the wafer, to be exposed. Therefore, the stage members for supporting the mask and the wafer, respectively, may be moved to displace the mask and the wafer translationally as a unit in the y axis direction. Since, in this case, the angle of incidence of the X-rays impinging on the mask M changes, the stages for supporting the mask and the wafer may be tilted to rotationally displace the mask and the wafer about the x axis. Also in this case, similarly to the method in which the mirror 2 is displaced, it is necessary that at a pre-stage before the setting the SOR orbit plane and the x' axis of the mirror 2 are parallel to each other (the x' axis may be contained in the SOR orbit plane) and that the X-rays emanating along the SOR orbit plane are perpendicular L(C to the x' axis of the mirror 2.

Also, as a matter of course, the setting of the exposure region 3 is attainable also by moving the mirror 2 in the manner described above and, in addition thereto, by moving the stop means, the mask and the wafer.

As another embodiment, the SOR light source used in the FIG. 1 embodiment was replaced by one having accumulated energy of 800 MeV and a radius of 2 m, the distance from the light emission point 1 to the mirror 2 being 5 m. The X-rays emitted from the SOR light source has a peak wavelength of about 0.9 nm and, in the synchrotron orbit radiation suitable for the X-ray lithography, it belongs to a category of long peak wavelength.

Figure 7:
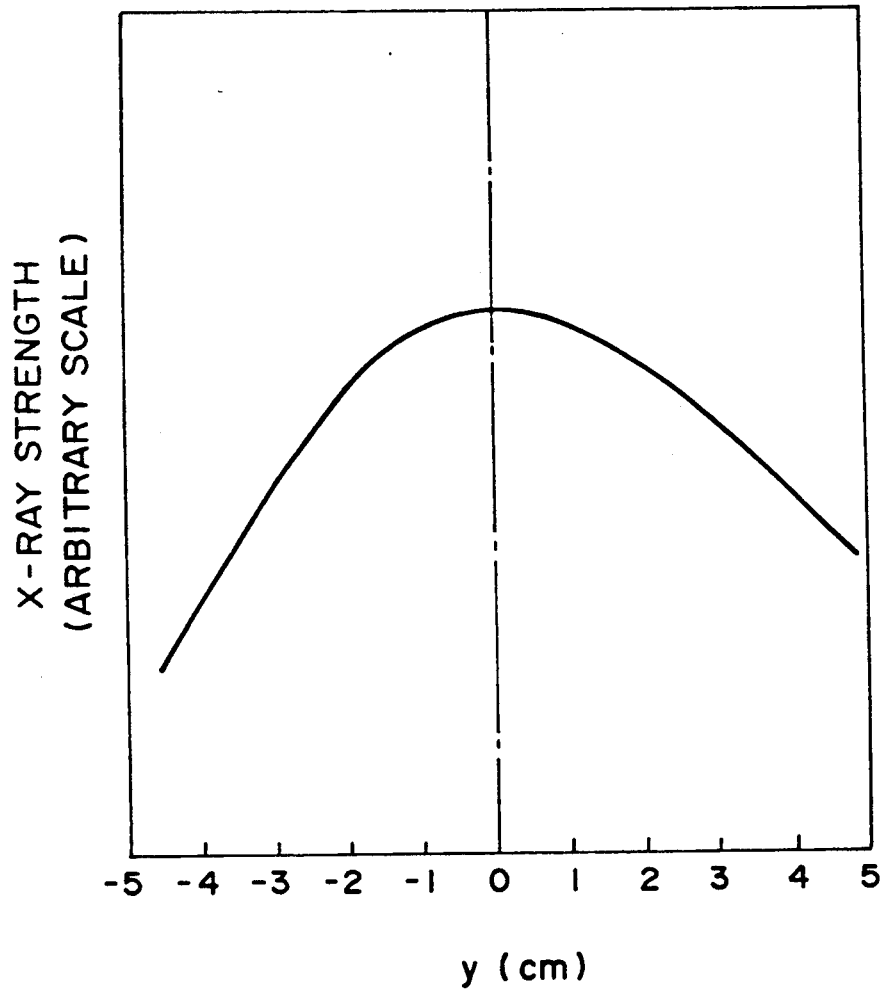
FIG. 7 is a graph showing an X-ray intensity distribution on a wafer, in the apparatus of FIG. 1.
Figure 8:
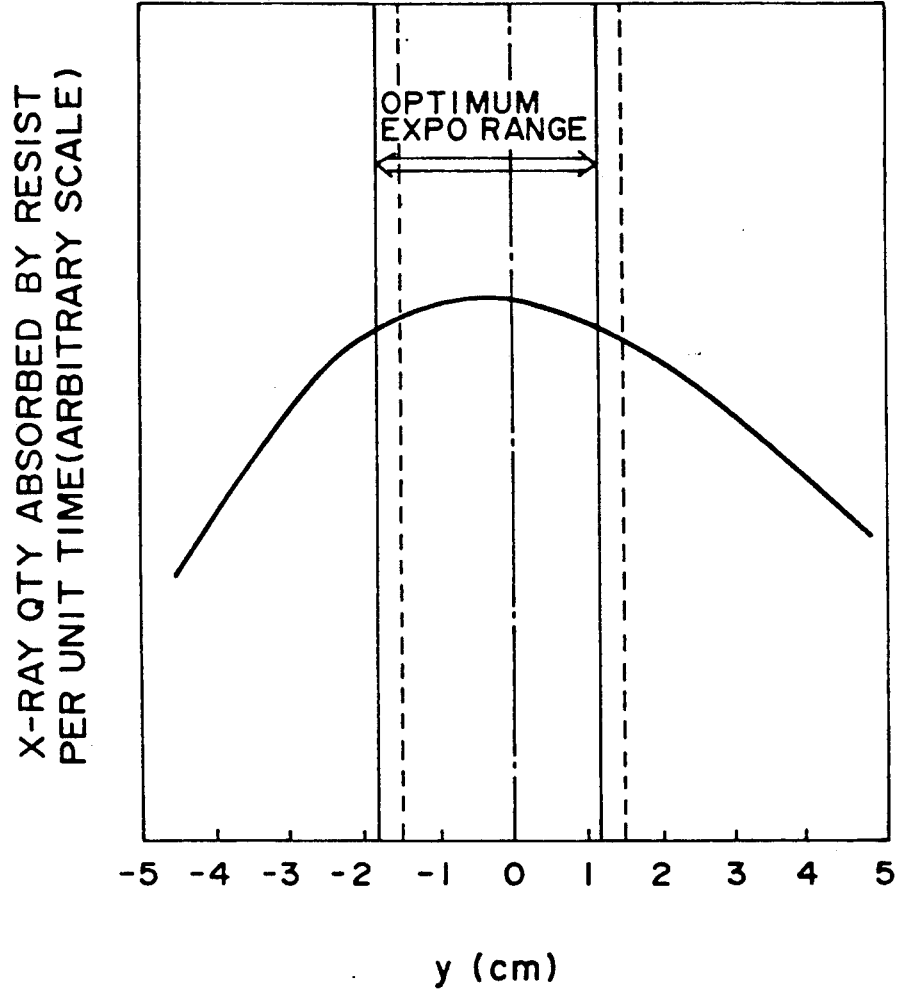
Figure 9:
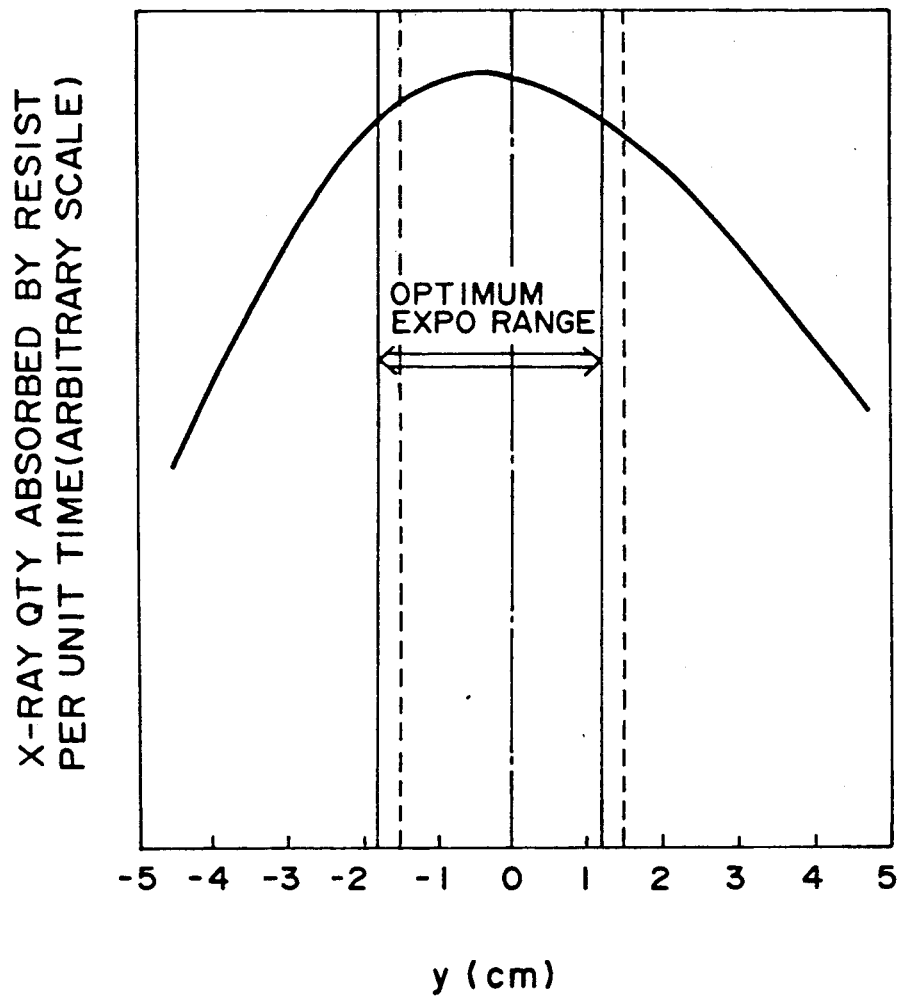

As examples of X-ray intensity distribution provided by such X-rays, FIG. 7 illustrates an X-ray intensity distribution upon a resist coated wafer, FIG. 8 illustrates a distribution of X-ray quantity absorbed by an acrylate resin resist per unit time in a case when a wafer coated with such a resist is exposed by the apparatus of the present embodiment, and FIG. 9 illustrates a distribution of X-ray quantity absorbed per unit time by a phenol-acrylate copolymer resist, containing a halogen series element, in a case when a wafer coated with such a resist is exposed with the apparatus of the present embodiment. In each case, the origin of the coordinate is set at the maximum intensity position of the distribution on the wafer. In these cases, the "optimum exposure region" by which the exposure time for the scanning exposure can be reduced to a minimum, is obtainable by setting the maximum X-ray intensity distribution (peak position) at a position (distance) of 40% from the mirror side of the exposure region 3

While the present embodiment was examined also based on the exposure region of a size of 30 mm square, if the size differs from this, most suitable values for the distance between the light emission point and the mirror, the distance between the mirror and the exposure region, the radius of curvature of the mirror and the like can be determined from the reduction in exposure time and stability of the apparatus, and they are different from those used in the present embodiment. However, by setting the position of the maximum intensity of the X-rays, after passing through the mask membrane, at a position of 20–45% in the exposure region, from the mirror side, it is possible to set the exposure region at a suitable position with respect to the X-rays. Also, while in the present embodiment a cylindrical mirror is used as the mirror 2, as a matter of course, a mirror having a convex shape in a one-dimensional direction or a toric mirror may be used.

In accordance with these embodiments of the present invention, as described hereinbefore, the position of the maximum intensity of an X-ray intensity distribution upon a wafer, after passage through a mask membrane, is set at a position within the exposure region, of 20–45% from the mirror side thereof and, as a result of this, the exposure time for the scanning exposure can be reduced.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a substrate with X-rays, said apparatus comprising:
 a radiation source for providing X-rays; and
 a convex mirror for reflecting the X-rays from said radiation source toward the substrate to expose a zone of the substrate with the X-rays;
 wherein said convex mirror and the substrate are so interrelated that a peak position of intensity distribution of the X-rays upon the zone continuously deviates from the center of the zone.

2. An apparatus according to claim 1, wherein said convex mirror and the substrate are so interrelated that approximately the same X-ray intensity is provided at an end portion of the zone, closest to said convex mirror, and another end portion of the zone at the opposite side thereof.

3. An apparatus according to claim 2, further comprising a scanner having an aperture movable along the substrate, between the end portions of the zone, so as to scanningly expose the zone, wherein the exposure of the zone is effected while moving the aperture to assure that, throughout the zone, the quantity of X-rays absorbed by a resist on the zone is made substantially uniform.

4. An X-ray exposure apparatus for exposing a zone of a wafer to a pattern of a mask with X-rays, said apparatus comprising:
 a radiation source for providing X-rays; and
 an illumination optical system for illuminating the mask and then the zone of the wafer with the X-rays, said illumination optical system including a convex mirror for reflecting the X-rays toward the mask and the wafer, wherein said convex mirror is disposed such that the X-rays irradiating the zone of the wafer provide an intensity distribution on the zone, in a predetermined direction, having a peak which is positioned at a distance from an end of the zone closer to said convex mirror, which distance provides irradiation of 20–45% of the area of the zone in the predetermined direction.

5. An x-ray exposure apparatus for exposing a zone of a wafer to a pattern of a mask with X-rays, said apparatus comprising:
 a synchrotron radiation source having a plane of horizontal orbit, for providing X-rays; and
 an illumination optical system for illuminating the mask and then the zone of the wafer with the X-rays, said illumination optical system including a convex mirror for reflecting the X-rays toward the mask and the wafer and being effective to expand a beam diameter of the X-rays with respect to a first direction which is perpendicular to the plane of horizontal orbit of said synchrotron radiation source, wherein said convex mirror is disposed such that the X-rays irradiating the zone of the wafer provide an intensity distribution on the zone having a peak which is positioned, with respect to a second direction corresponding on the zone to the first direction, at a distance from an end of the zone closer to said convex mirror, which distance provides irradiation of 20–45% of the area of the zone in the second direction.

6. An x-ray exposure apparatus for exposing a zone of a wafer to a pattern of a mask with X-rays, said apparatus comprising:
 a synchrotron radiation source having a plane of horizontal orbit, for providing X-rays; and
 an illumination optical system for illuminating the mask and then the zone of the wafer with the X-rays, said illumination optical system including a convex mirror for reflecting the X-rays toward the mask and the wafer and being effective to expand a beam diameter of the X-rays with respect to a first direction which is perpendicular to the plane of horizontal orbit of said synchrotron radiation source, said illumination optical system further including a scanner for scanning the zone of the wafer with the diameter-expanded X-rays, said scanner having an opening of a predetermined shape and being movable in a second direction along the mask and corresponding on the zone of the wafer to the first direction;

wherein said convex mirror is disposed such that the X-rays irradiating the zone of the wafer provide an intensity distribution on the zone having a peak which is positioned, with respect to the second direction, at a distance from an end of the zone closer to said convex mirror, which distance provides irradiation of 20–45% of the area of the zone in the second direction.

* * * * *

UNITED STATES PATENT AND TRADEMARK OFFICE
CERTIFICATE OF CORRECTION

PATENT NO. : 5,125,014

DATED : June 23, 1992

INVENTOR(S) : Yutaka Watanabe et al

It is certified that error appears in the above-identified patent and that said Letters Patent is hereby corrected as shown below:

ON THE TITLE PAGE:    Item [75]

"Nobutoshi Mitzusawa" should be --Nobutoshi Mizusawa--.

Signed and Sealed this

Tenth Day of November, 1992

*Attest:*

DOUGLAS B. COMER

*Attesting Officer*     *Acting Commissioner of Patents and Trademarks*

UNITED STATES PATENT AND TRADEMARK OFFICE
CERTIFICATE OF CORRECTION

PATENT NO. : 5,125,014

DATED : December 24, 1991

INVENTOR(S) : Charles E. Kepler

It is certified that error appears in the above-identified patent and that said Letters Patent is hereby corrected as shown below:

Column 8, Claim 1, line 19, "he" should be ---the---.

Column 8, Claim 2, line 49, "ins aid" should be ---in said---.

Signed and Sealed this

Twenty-eighth Day of September, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    : 5,125,014
DATED         : June 23, 1992
INVENTOR(S)   : Yutaka Watanabe et al.

It is certified that error appears in the above-identified patent and that said Letters Patent is hereby corrected as shown below:

Column 1,
Line 18, "cf" should read -- of --; and
Line 60, "ba solved" should read -- be solved. --.

Column 2,
Line 22, "differs" should read -- differs. --; and
Line 36, "differs" should read -- differs. --.

Column 3,
Line 6, "irradiation" should read -- irradiation of --; and
Line 30, "x-ray" should read -- X-ray --.

Column 5,
Line 24, "x´z´ plane" should read -- x´-z´ plane --; and
Line 35, "coordinate system xy" should read -- coordinate system xyz --.

Column 6,
Line 32, "largely" should read -- largely. --.

Column 7,
Line 18, "be" should be deleted;
Line 42, "position" should read -- position. --; and
Line 66, "determined" should read -- determined. --.

Column 8,
Line 42, "other" should read -- other. --;
Line 59, "setting" should read -- setting, --; and
Line 63, "L(C" should be deleted.

Column 9,
Line 28, "3" should read -- 3. --.

UNITED STATES PATENT AND TRADEMARK OFFICE
CERTIFICATE OF CORRECTION

PATENT NO. : 5,125,014
DATED : June 23, 1992
INVENTOR(S) : Yutaka Watanabe et al.

It is certified that error appears in the above-identified patent and that said Letters Patent is hereby corrected as shown below:

<u>Column 10,</u>
Line 35, "x-ray" should read -- X-ray --; and
Line 57, "x-ray" should read -- X-ray --.

This certificate supersedes Certificate of Correction issued September 28, 1993.

Signed and Sealed this

Fourth Day of February, 2003

JAMES E. ROGAN
*Director of the United States Patent and Trademark Office*